(12) United States Patent
Liu

(10) Patent No.: US 9,151,805 B2
(45) Date of Patent: Oct. 6, 2015

(54) TEST MACHINE AND THE TEST METHOD FOR LIGHT EMITTING DIODE BACKLIGHT DRIVER, AND, MANUFACTURING METHOD FOR MONITOR POWER BOARD

(71) Applicant: WISTRON CORP., New Taipei (TW)

(72) Inventor: Tia-Jing Liu, New Taipei (TW)

(73) Assignee: Wistron Corp., New Taipei (TW)

( * ) Notice: Subject to any disclaimer, the term of this patent is extended or adjusted under 35 U.S.C. 154(b) by 263 days.

(21) Appl. No.: 13/846,065

(22) Filed: Mar. 18, 2013

(65) Prior Publication Data

US 2014/0009161 A1    Jan. 9, 2014

(30) Foreign Application Priority Data

Jul. 4, 2012 (CN) .......................... 2012 1 0230046

(51) Int. Cl.
| | |
|---|---|
| *G01R 31/00* | (2006.01) |
| *G01R 31/44* | (2006.01) |
| *G01F 3/00* | (2006.01) |
| *G01R 31/28* | (2006.01) |
| *G01R 31/3161* | (2006.01) |

(52) U.S. Cl.
CPC *G01R 31/44* (2013.01); *G01F 3/00* (2013.01); *G01R 31/2806* (2013.01); *G01R 31/3161* (2013.01); *Y10T 29/49004* (2015.01)

(58) Field of Classification Search
CPC .... G01R 31/06; G01R 31/44; G01R 31/2635; G01R 31/02; G09G 3/32; H05B 37/02
USPC .............. 324/414, 158.1, 754, 755, 757, 758, 324/765; 315/193, 297, 312; 307/31; 345/82
See application file for complete search history.

(56) References Cited

U.S. PATENT DOCUMENTS

| | | | |
|---|---|---|---|
| 6,876,211 B2 * | 4/2005 | Chung et al. .............. | 324/750.25 |
| 2008/0088550 A1 * | 4/2008 | Kim et al. ........................ | 345/82 |
| 2011/0080101 A1 * | 4/2011 | Chen ............................ | 315/193 |

FOREIGN PATENT DOCUMENTS

TW        201035574 A1    10/2010

OTHER PUBLICATIONS

Do Hung Nguyen, Jaber Hasan, and Simon S. Ang, "A Built-In Self-Test High-Current LED Driver," 2009, IEEE, ASIC, ASICON '09, 340-343, DOI: 10.1109/ASICON.2009.5351429.*

* cited by examiner

*Primary Examiner* — Arleen M Vazquez
*Assistant Examiner* — Steven Yeninas

(57) ABSTRACT

A test machine and a test method for a Light Emitting Diode (LED) backlight driver and a manufacturing method for a monitor power board The test machine has a switch-controlled LED-light-bar load that is coupled to an LED backlight driver on a monitor power board. The switch-controlled LED-light-bar load includes a plurality of light bars and a plurality of switches. Each light bar has a plurality of the LEDs which are connected in series. Each switch is connected in parallel to a portion of the LEDs of one light bar such that an effective amount of the LEDs of each light bar is adjustable. The switches are controlled according to a monitor specification that the monitor power board is adapted to.

9 Claims, 6 Drawing Sheets

TEST MACHINE AND THE TEST METHOD FOR LIGHT EMITTING DIODE BACKLIGHT DRIVER, AND, MANUFACTURING METHOD FOR MONITOR POWER BOARD

CROSS REFERENCE TO RELATED APPLICATIONS

This Application claims priority of China Patent Application No. 201210230046.3, filed on Jul. 4, 2012, the entirety of which is incorporated by reference herein.

BACKGROUND OF THE DISCLOSURE

1. Field of the

The present disclosure relates to test technology for a Light Emitting Diode (LED) backlight driver of a monitor power board, and, the disclosure further relates to a manufacturing method for a monitor power board.

2. Description of the Related Art

Currently, monitors, such as LCD displays, generally require a backlight module for back lighting. Light emitting diodes are commonly used as the backlight source and may be designed into a Light Emitting Diode (LED) backlight module. Generally, an LED backlight driver is assembled on a monitor power board to drive the LED backlight module.

Considering costs, all components of an electrical device should be tested before being assembled together. For example, before assembling a monitor, a reliability test for the monitor power board is required. When all components pass the tests, costs associated with disassembly and damage (e.g. damage of the fragile monitor casing) due to problem components are eliminated. Additionally, the LED backlight driver assembled on the monitor power board should also be tested. Professional instruments, such as an LED load, are commercially available from equipment manufacturers to test the LED backlight driver. However, the commercially available LED load is very expensive.

BRIEF SUMMARY OF THE DISCLOSURE

A test machine and a test method for an LED backlight driver and a manufacturing method for a monitor power board are disclosed.

In accordance with an exemplary embodiment of the disclosure, a test machine for an LED backlight driver comprises a test instrument and a switch-controlled LED-light-bar load. The test instrument provides testing probes to contact welds of a monitor power board. The switch-controlled LED-light-bar load is coupled to the test instrument. Through the testing probes of the test instrument, the switch-controlled LED-light-bar load is coupled to an LED backlight driver assembled on the monitor power board. The switch-controlled LED-light-bar load includes a plurality of light bars and a plurality of switches. Each light bar contains a plurality of the LEDs connected in series. Each switch is connected with a portion of the LEDs in one light bar. In this manner, an effective amount of the LEDs of each light bar is adjustable. The switches are controlled according to the monitor specification that the monitor power board is adapted to.

In accordance with another exemplary embodiment of the disclosure, a test method for an LED backlight driver couples a switch-controlled LED-light-bar load to the LED backlight driver assembled on a monitor power board. The switch-controlled LED-light-bar load includes a plurality of light bars and a plurality of switches. Each light bar includes a plurality of the LEDs connected in series. Each switch is connected in parallel to a portion of the LEDs of one light bar. In this manner, an effective amount of the LEDs in each light bar is adjustable. Further, the disclosed method further comprises the following steps: controlling the switches of the switch-controlled LED-light-bar load in accordance with a monitor specification that the monitor power board is adapted to; coupling an AC power source to a switched power source of the monitor power board, wherein the switched power source is further coupled to the LED backlight driver; providing the LED backlight driver with a backlight on/off control signal and a backlight intensity control signal; recording a driving voltage that the LED backlight driver outputs to the switch-controlled LED-light-bar load; and, based on the recorded driving voltage, determining whether the LED backlight driver is operating normally.

In accordance with another exemplary embodiment of the disclosure, a manufacturing method for a monitor power board couples a switch-controlled LED-light-bar load to an LED backlight driver of the monitor power board before product packaging. The switch-controlled LED-light-bar load includes a plurality of light bars and a plurality of switches. Each light bar includes a plurality of the LEDs which are connected in series. Each switch is connected in parallel to a portion of the LEDs of one light bar. In this manner, an effective amount of the LEDs of each light bar is adjustable. Further, the disclosed manufacturing method further includes the following steps: controlling the switches of the switch-controlled LED-light-bar load in accordance with a monitor specification that the monitor power board is adapted to; coupling an AC power source to a switched power source of the monitor power board, wherein the switched power source is further coupled to the LED backlight driver; recording a driving voltage that the LED backlight driver outputs to the switch-controlled LED-light-bar load; determining whether the LED backlight driver is operating normally based on the recorded driving voltage; and, packaging the monitor power board after determining that the LED backlight driver is operating normally.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE DISCLOSURE

Figure 1A:
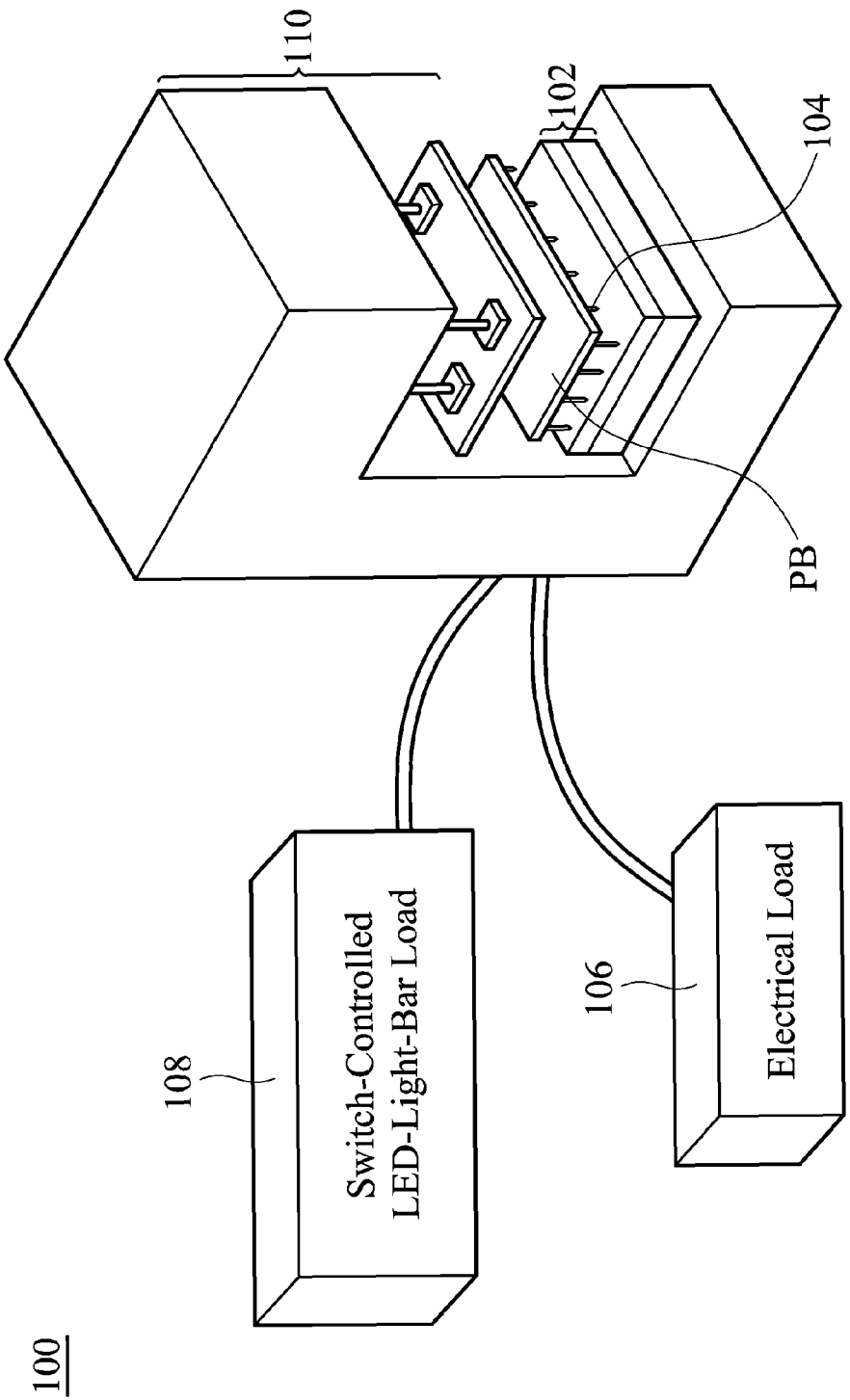
FIG. 1A depicts a test machine 100 for an LED backlight driver in accordance with an exemplary embodiment of the disclosure.

The following description shows several exemplary embodiments carrying out the disclosure. This description is made for the purpose of illustrating the general principles of the disclosure and should not be taken in a limiting sense. The scope of the disclosure is best determined by reference to the appended claims.

FIG. 1A depicts a test machine 100 for an LED backlight driver. The test machine 100 tests a monitor power board PB. The test machine 100 comprises a test instrument (providing testing probes 104), an electrical load 106, a switch-controlled LED-light-bar load 108 and a mechanical press 110.

As shown, the test instrument 102 provides a space to place the monitor power board PB thereon such that welds of the monitor power board PB contact with the testing probes 104 of the test instrument 102. The mechanical press 110 downwardly presses the monitor power board PB so that the welds thereof may more closely contact with the testing probes 104 of the test instrument 102.

Figure 1B:
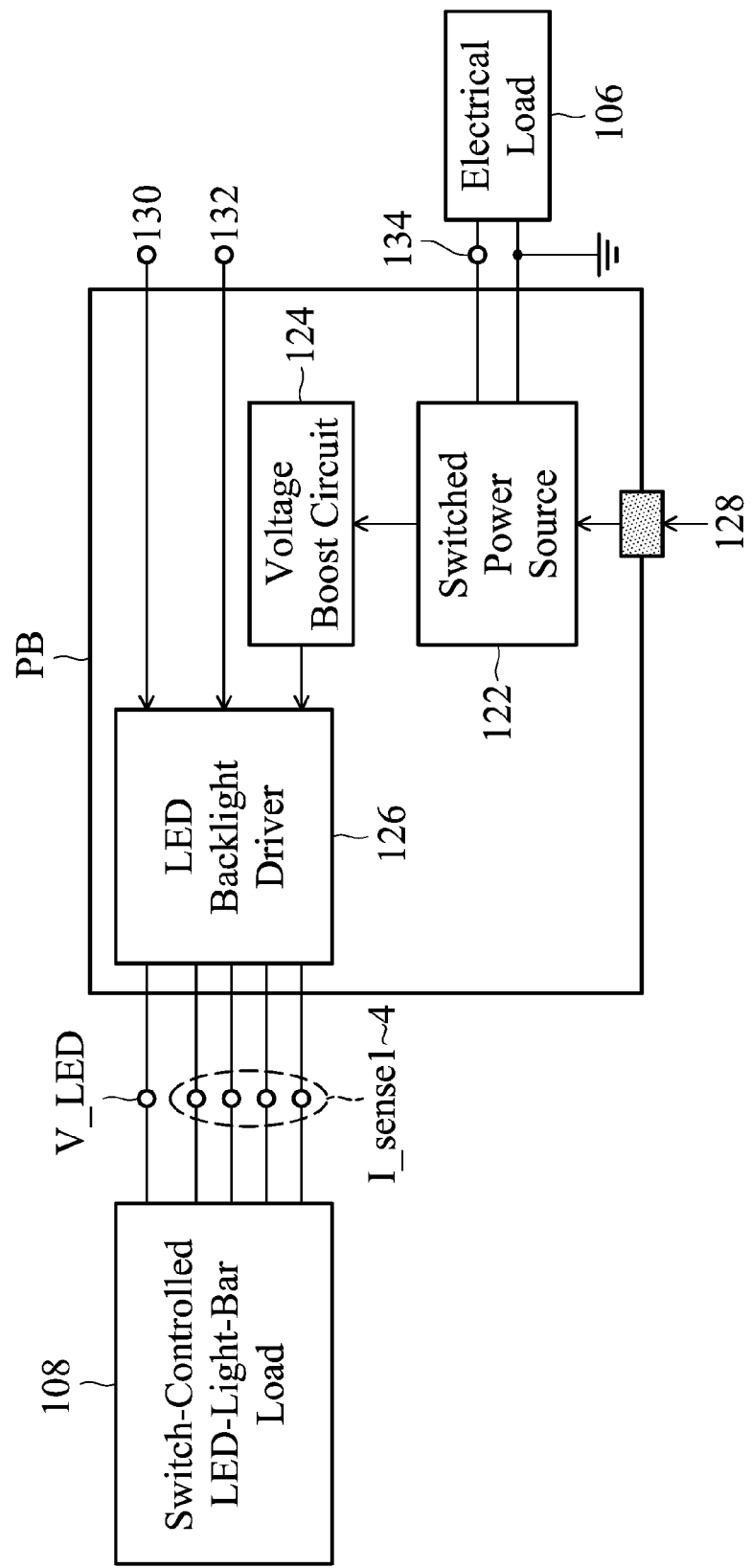
FIG. 1B depicts how the internal functional blocks of a monitor power board PB are connected to an electrical load 106 and a switch-controlled LED-light-bar load 108.

Further, the test instrument 102 may be coupled to the electrical load 106 and the switch-controlled LED-light-bar load 108 via cables (as shown in FIG. 1A). Via the testing probes 104, the electrical load 106 and the switch-controlled LED-light-bar load 108 are coupled to the internal functional blocks of the monitor power board 108. FIG. 1B shows how the internal functional blocks of the monitor power board PB are connected to the electrical load 106 and the switch-controlled LED-light-bar load 108 in detail.

Refer to FIG. 1B, the internal functional blocks of the monitor power board PB are discussed first. The monitor power board PB may comprise a switched power source 122, a voltage boost circuit 124 and an LED backlight driver 126. An external AC power source 128 is coupled to and processed by the switched power source 122 and the voltage boost circuit 124 and then is provided to the LED backlight driver 126. The powered LED backlight driver 126 operates according to a backlight on/off control signal 130 and a backlight intensity control signal 132. The switched power source 122 further generates DC power at a DC power output terminal 134 of the monitor power board PB.

To test the monitor power board PB, the electrical load 106 is coupled to the DC power output terminal 134 to mimic a DC load, and, the switch-controlled LED-light-bar load 108 mimics a backlight module that the LED backlight driver 126 is designed to drive. Following, tests for the LED backlight driver 126 are discussed. When receiving power from the AC power source 128 and receiving the backlight on/off control signal 130 and the backlight intensity control signal 132, the LED backlight driver 126 provides the switch-controlled LED-light-bar load 108 with a driving voltage V_LED. Currents I_sense1~4 are fed back to the LED backlight driver 126 to be considered for enabling of circuit protection. By comparing the driving voltage V_LED with an expected value, it is determined whether the LED backlight driver 126 is operating normally.

Figure 2:
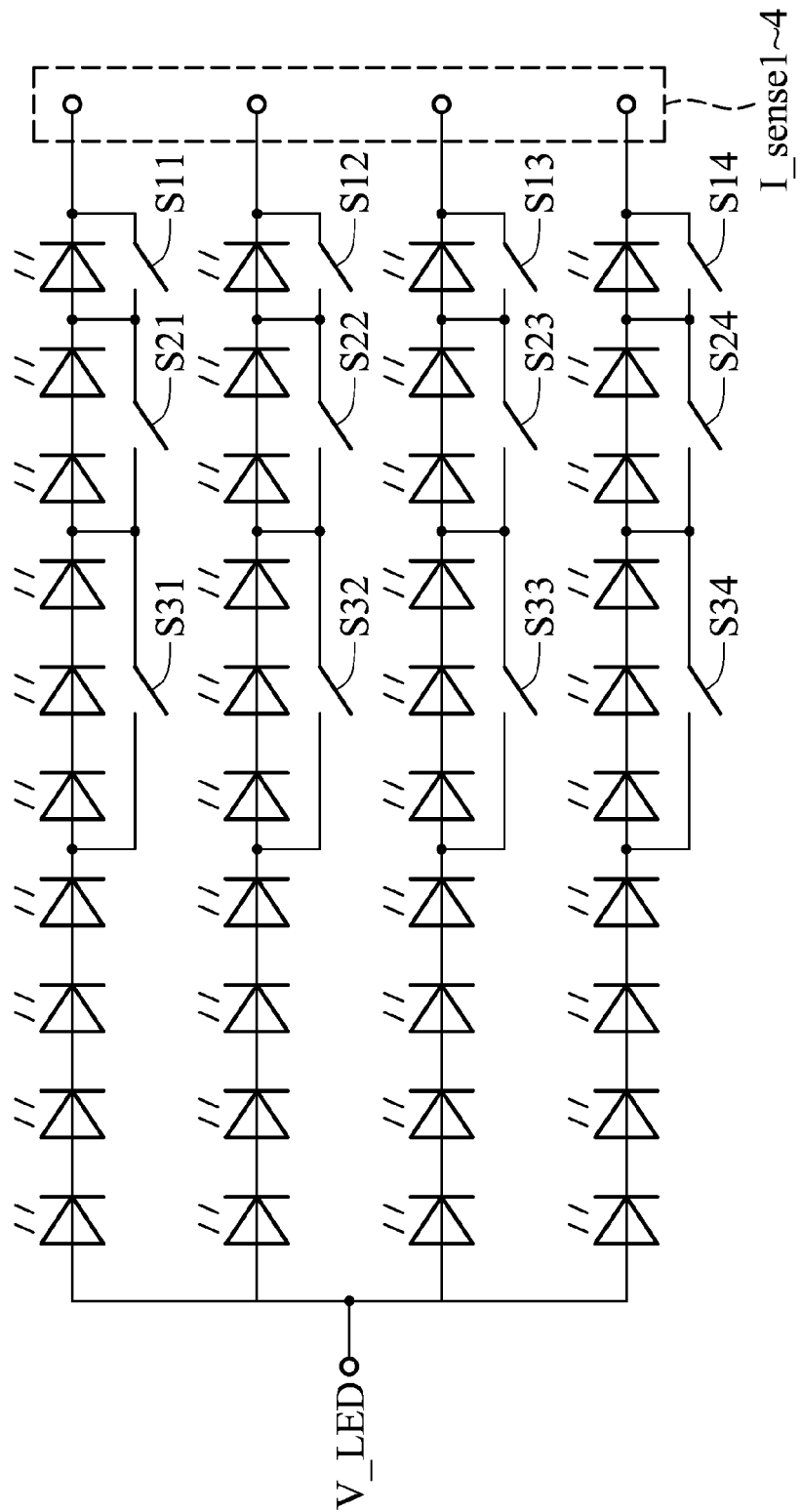
FIG. 2 depicts a switch-controlled LED-light-bar load in accordance with an exemplary embodiment of the disclosure.

FIG. 2 further depicts a specially designed structure of the switch-controlled LED-light-bar load 108. As shown, an exemplary circuit 200 of the a switch-controlled LED-light-bar load 108 comprises four light bars and twelve switches S11~S14, S21~S24, S31~S34.

Each light bar shown in FIG. 2 comprises ten LEDs connected in series. The LEDs may be manufactured by specific materials. For example, in comparison with conventional LEDs used in a conventional backlight module, the LEDs of the circuit 200 work according to a higher forward current parameter IF, to bear a higher operating current.

In FIG. 2, each switch is connected in parallel to a portion of the LEDs of one light bar. In this manner, an effective amount of the LEDs in each light bar is adjustable. Note that the switches S11~S14, S21~S24, S31~S34 are controlled according to a monitor specification that the monitor power board PB is adapted to. The following table lists the status of the switches S11~S14, S21~S24 and S31~S34 when different monitor specifications are used:

| Monitor Specification (Classified by V_LED) | S11~S14 | S21~S24 | S31~S34 | Effective amount of the LEDs in each light bar |
|---|---|---|---|---|
| 24 V | ON | ON | ON | 4 |
| 48 V | OFF | ON | OFF | 8 |
| 60 V | OFF | OFF | OFF | 10 |

As shown, the exemplary circuit 200 of the switch-controlled LED-light-bar load 108 can mimic backlight modules of at least three different monitor specifications. The switching control is convenient and inexpensive.

Note that the number of the LEDs in each light bar is not limited to that shown in FIG. 2 and may depend on user demand.

Figure 3:
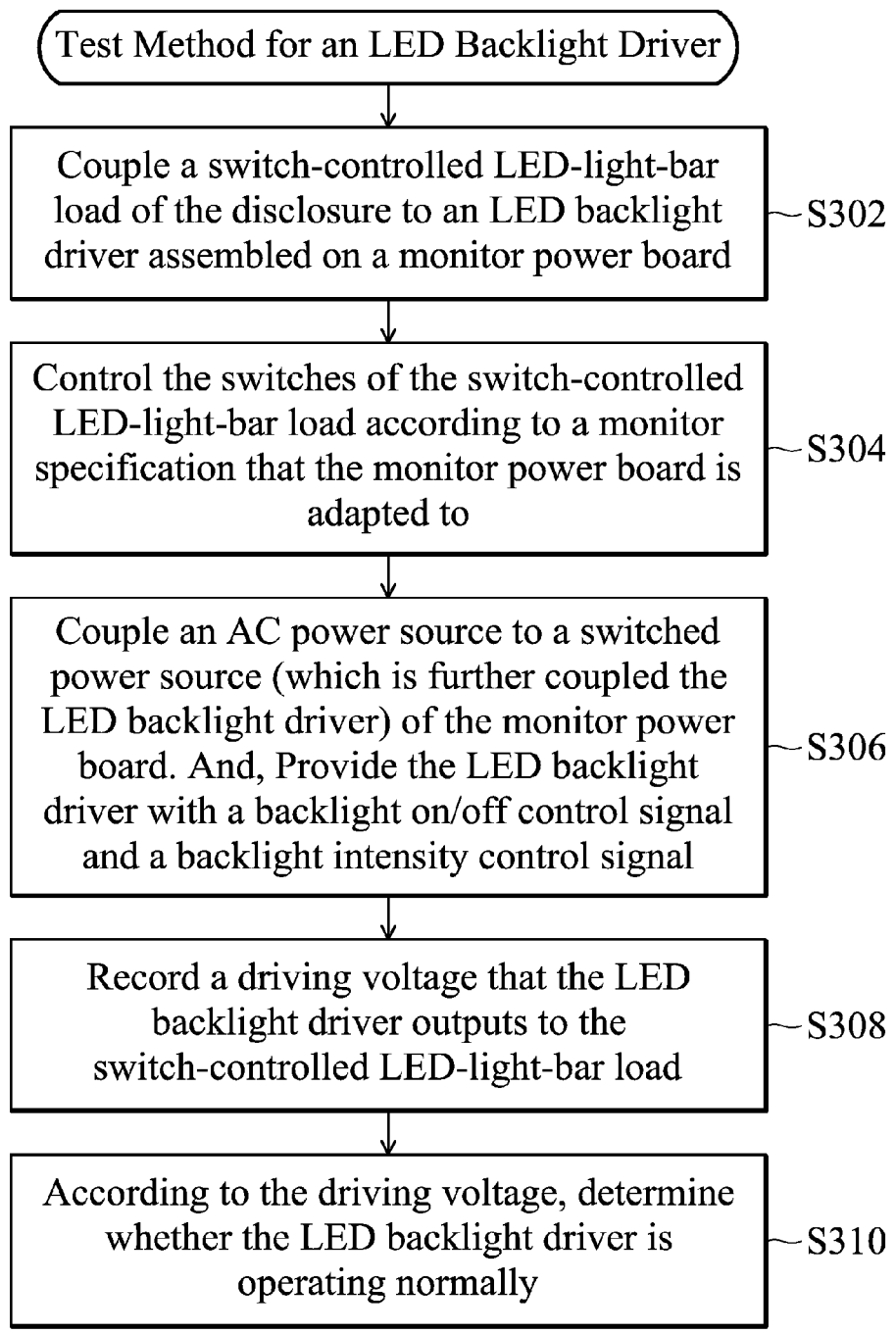
FIG. 3 is a flowchart depicting a test method for an LED backlight driver.

FIG. 3 shows a flowchart depicting a test method for an LED backlight driver, wherein the aforementioned switch-controlled LED-light-bar load (e.g. 108) is utilized. In step S302, one aforementioned switch-controlled LED-light-bar load 108 is coupled to an LED backlight driver 126 of a monitor power board PB. In step S304, the switches of the switch-controlled LED-light-bar load 108 are controlled according to a monitor specification that the monitor power board PB is adapted to (refer to the aforementioned table). In step S306, an AC (alternating current) power source is coupled to a switched power source 122 of the monitor power board PB. The switched power source 122 is coupled the LED backlight driver 126. Further, in step S306, the LED backlight driver 126 is provided with a backlight on/off control signal 130 and a backlight intensity control signal 132. In step S308, a driving voltage V_LED that the LED backlight driver 126 outputs to the switch-controlled LED-light-bar load 108 is recorded. In step S310, it is determined whether the LED backlight driver 126 is operating normally according to the driving voltage V_LED. In an exemplary embodiment, the recorded driving voltage V_LED is compared with an expected value when determining whether the LED backlight driver 126 is operating normally.

Figure 4:
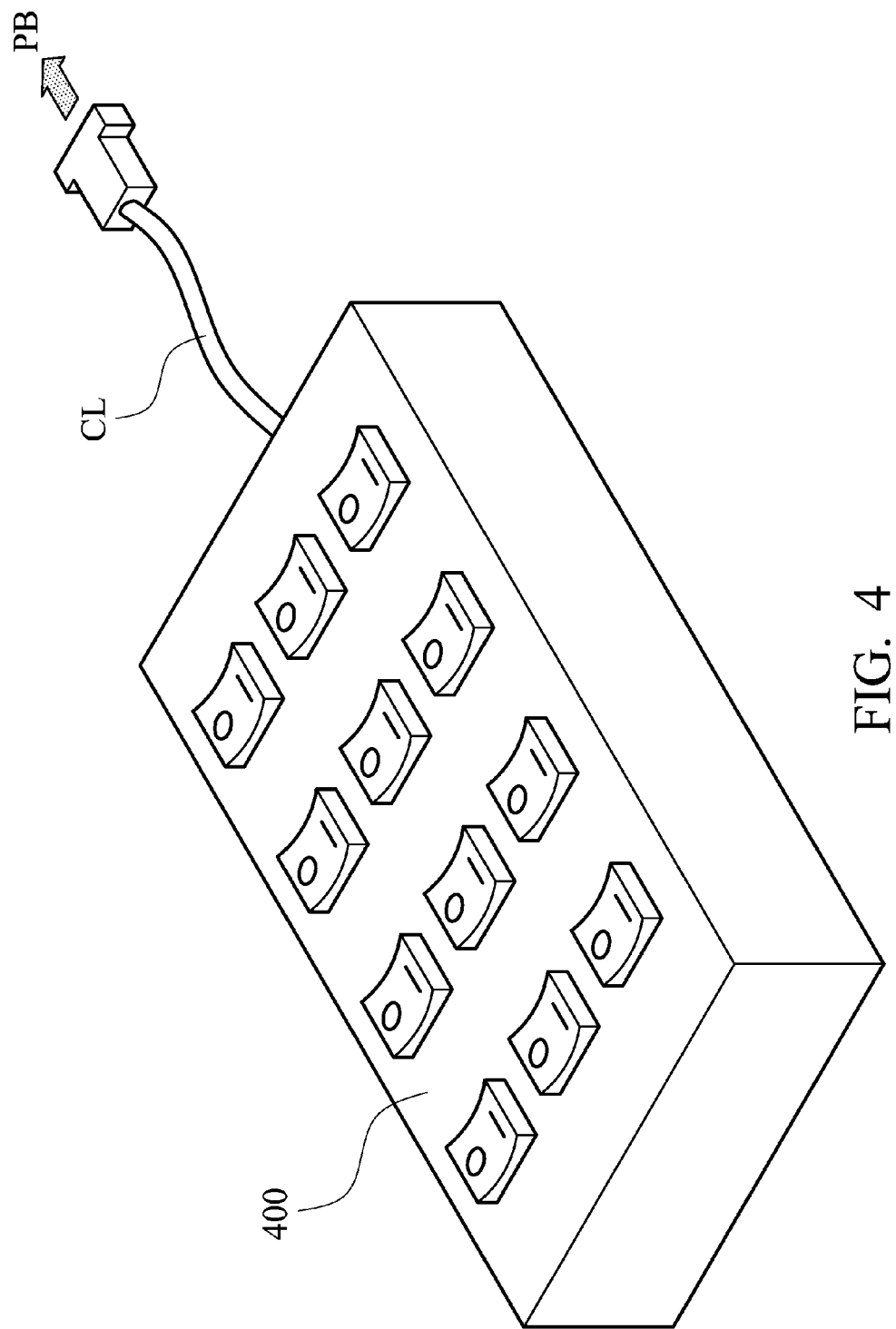
FIG. 4 shows a casing design of an exemplary circuit 200 of the switch-controlled LED-light-bar load 108.

In an exemplary embodiment, the switches of the switch-controlled LED-light-bar load 108 are controlled manually. FIG. 4 shows a casing design for the circuit 200 of FIG. 2. The twelve switches S11~S14, S21~S24 and S31~S34 of the circuit 200 may be separately controlled through the twelve manual switches assembled on the casing 400. Via a cable CL, the load shown in FIG. 4 is coupled with the monitor power board PB under test.

In another exemplary embodiment, the switches of the load 108 may be controlled according to a software program.

Figure 5:
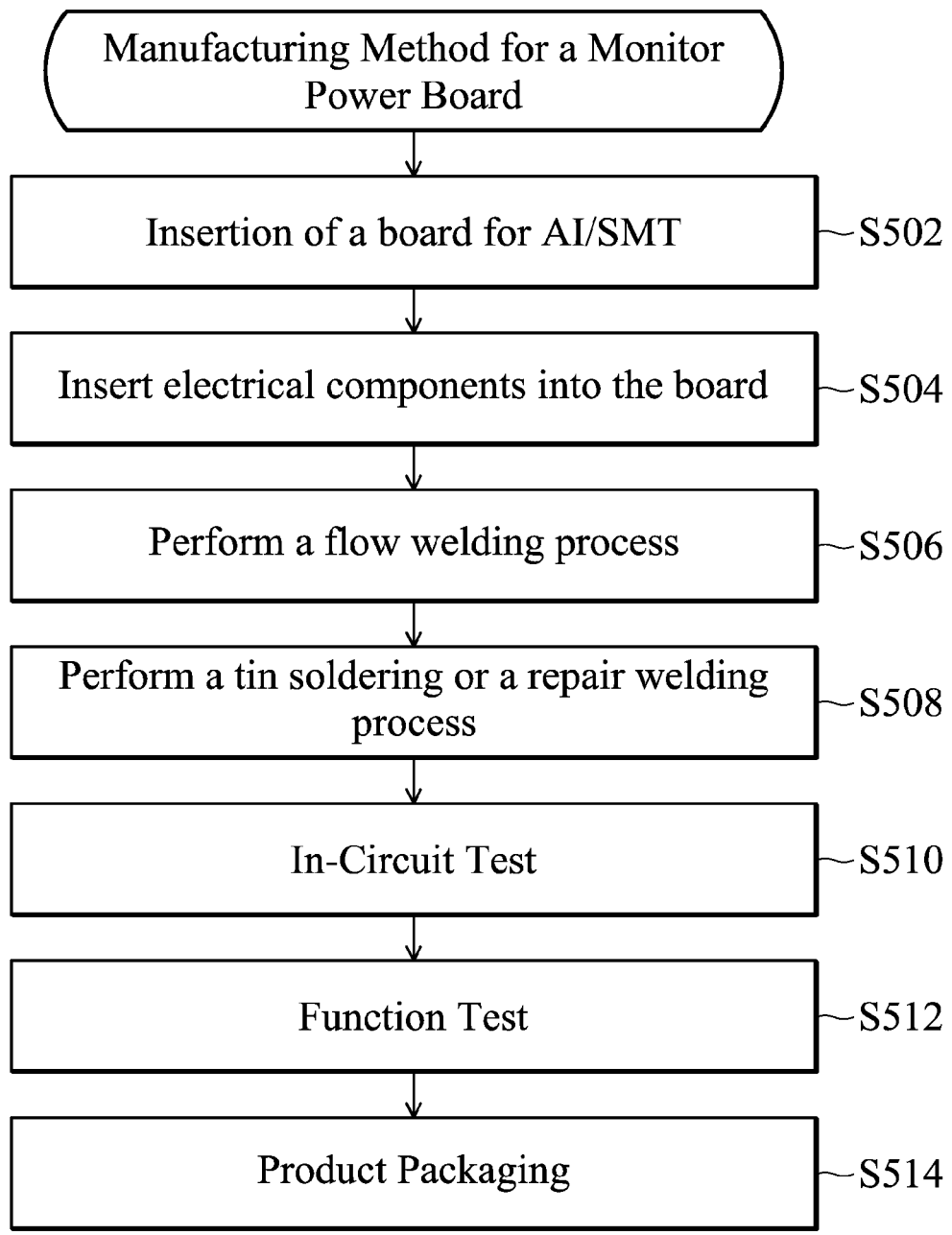
FIG. 5 is a flowchart showing a manufacturing method for a monitor power board.

The disclosed test technology for the LED backlight driver may be used when manufacturing a monitor power board. FIG. 5 is a flowchart depicting a manufacturing method for a monitor power board. In step S502, a board is inserted into the manufacturing system for Auto-Insert and Surface Mounting Technology (AI/SMT). In step S504, electrical components are inserted into the board. In step S506, a flow welding process is performed. In step S508, a tin soldering or a repair welding process is performed. In step S510, an In-Circuit Test (ICT) is performed. In step S512, a function test is performed. In step S514, the product is packaged. The LED backlight driver test technology of the disclosure (e.g. the method depicted by FIG. 3) may be used in the function test of step S512, prior to the product packaging of step S514.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A test machine for testing an LED backlight driver of a monitor power board, comprising:
    a test instrument, providing testing probes to contact welds of the monitor power board; and
    a switch-controlled LED-light-bar load, coupled to the test instrument, wherein, via the testing probes of the test instrument, the switch-controlled LED-light-bar load is coupled to the LED backlight driver,
    wherein the switch-controlled LED-light-bar load comprises:
        a plurality of light bars, wherein each light bar includes a plurality of the LEDs connected in series;
        a plurality of switches, wherein each switch is connected in parallel to a portion of the LEDs of one light bar such that an effective amount of the LEDs of each light bar is adjustable, and, the switches are controlled according to a monitor specification that the monitor power board is adapted to.

2. The test machine as claimed in claim 1, wherein the test instrument further couples an AC power source to a switched power source of the monitor power board, and the switched power source is further coupled to the LED backlight driver, and the test instrument further provides the LED backlight driver with a backlight on/off control signal and a backlight intensity control signal.

3. The test machine as claimed in claim 2, wherein the test instrument further records a driving voltage that the LED backlight driver outputs to the switch-controlled LED-light-bar load, to determine whether the LED backlight driver is operating normally.

4. The test machine as claimed in claim 1, wherein a forward current parameter of the LEDs of the light bars of the switch-controlled LED-light-bar load is higher than a forward current parameter of the LEDs of a backlight module of a monitor, and the monitor is equipped with the monitor power board.

5. The test machine as claimed in claim 1, further comprising:
    a mechanical press, closely contacting the testing probes of the test instrument with the welds of the monitor power board.

6. A test method for an LED backlight driver, comprising:
    coupling a switch-controlled LED-light-bar load to an LED backlight driver of a monitor power board, wherein the switch-controlled LED-light-bar load comprises:
        a plurality of light bars, wherein each light bar comprises a plurality of the LEDs connected in series; and
        a plurality of switches, wherein each switch is connected in parallel to a portion of the LEDs of one light bar such that an effective amount of the LEDs in each light bar is adjustable;
    controlling the switches of the switch-controlled LED-light-bar load according to a monitor specification that the monitor power board is adapted to;
    coupling an AC power source to a switched power source of the monitor power board, wherein the switched power source is further coupled to the LED backlight driver;
    providing the LED backlight driver with a backlight on/off control signal and a backlight intensity control signal;
    recording a driving voltage that the LED backlight driver outputs to the switch-controlled LED-light-bar load; and
    based on the recorded driving voltage, determining whether the LED backlight driver is operating normally.

7. The test method as claimed in claim 6, wherein a forward current parameter of the LEDs of the light bars of the switch-controlled LED-light-bar load is higher than a forward current parameter of the LEDs of a backlight module of a monitor, and the monitor is equipped with the monitor power board.

8. A manufacturing method for a monitor power board, comprising:
    coupling a switch-controlled LED-light-bar load to an LED backlight driver of the monitor power board before product packaging, wherein the switch-controlled LED-light-bar load comprises:
        a plurality of light bars, wherein each light bar comprises a plurality of the LEDs connected in series; and
        a plurality of switches, wherein each switch is connected in parallel to a portion of the LEDs of one light bar such that an effective amount of the LEDs in each light bar is adjustable;
    controlling the switches of the switch-controlled LED-light-bar load according to a monitor specification that the monitor power board is adapted to;
    coupling an AC power source to a switched power source of the monitor power board, wherein the switched power source is further coupled to the LED backlight driver;
    providing the LED backlight driver with a backlight on/off control signal and a backlight intensity control signal;
    recording a driving voltage that the LED backlight driver outputs to the switch-controlled LED-light-bar load;
    based on the driving voltage, determining whether the LED backlight driver is operating normally; and
    packaging the monitor power board after it is determined that the LED backlight driver is operating normally.

9. The manufacturing method as claimed in claim 8, wherein a forward current parameter of the LEDs of the light bars of the switch-controlled LED-light-bar load is higher than a forward current parameter of the LEDs of a backlight module of a monitor, and the monitor is equipped with the monitor power board.

* * * * *